United States Patent
Heinikoski et al.

(10) Patent No.: US 10,103,775 B2
(45) Date of Patent: Oct. 16, 2018

(54) METHOD AND RADIO NODE FOR CONTROLLING RADIO TRANSMISSION

(71) Applicant: TELEFONAKTIEBOLAGET LM ERICSSON (PUBL), Stockholm (SE)

(72) Inventors: Kauko Heinikoski, Oulu (FI); Marko E Leinonen, Haukipudas (FI)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/313,164

(22) PCT Filed: May 27, 2014

(86) PCT No.: PCT/SE2014/050652
§ 371 (c)(1),
(2) Date: Nov. 22, 2016

(87) PCT Pub. No.: WO2015/183147
PCT Pub. Date: Dec. 3, 2015

(65) Prior Publication Data
US 2017/0195005 A1    Jul. 6, 2017

(51) Int. Cl.
| | |
|---|---|
| *H04B 1/62* | (2006.01) |
| *H03F 1/32* | (2006.01) |
| *H04B 1/04* | (2006.01) |
| *H04B 7/06* | (2006.01) |
| *H04B 10/69* | (2013.01) |
| *H04B 1/525* | (2015.01) |

(52) U.S. Cl.
CPC ............ *H04B 1/62* (2013.01); *H03F 1/3247* (2013.01); *H04B 1/0475* (2013.01); *H04B 7/0639* (2013.01); *H04B 10/697* (2013.01); *H04B 1/525* (2013.01); *H04B 2001/0425* (2013.01); *H04B 2210/25* (2013.01)

(58) Field of Classification Search
CPC ... H03F 1/3241; H03F 1/3247; H04B 1/0475; H04B 1/525; H04B 1/62
See application file for complete search history.

(56) References Cited

U.S. PATENT DOCUMENTS

| | | | |
|---|---|---|---|
| 8,380,144 B1* | 2/2013 | Bai ...................... | H03F 1/3247 375/296 |
| 2005/0110567 A1* | 5/2005 | Rabinovich ........... | H03F 1/3235 330/149 |
| 2006/0240786 A1* | 10/2006 | Liu ....................... | H03F 1/3247 455/114.3 |

(Continued)

FOREIGN PATENT DOCUMENTS

| | | |
|---|---|---|
| EP | 1968201 A1 | 9/2008 |
| RU | 128426 U1 | 5/2013 |

*Primary Examiner* — Duc M Nguyen

(57) ABSTRACT

A method and radio node for controlling transmission of radio signals in a transmitter band to avoid or reduce interference in a victim band, the victim band being separate from the transmitter band in frequency domain. The radio node applies Digital Pre-Distortion, DPD, on signals to be transmitted on at least one carrier in the transmitter band, such that Intermodulation Distortion, IMD, components of the signals are pre-distorted asymmetrically relative the at least one carrier to suppress at least one of the IMD components falling within the victim band. The pre-distorted signals are then amplified in a power amplifier and transmitted on the at least one carrier.

13 Claims, 4 Drawing Sheets

(56) References Cited

U.S. PATENT DOCUMENTS

| | | | |
|---|---|---|---|
| 2008/0144709 A1* | 6/2008 | McCallister | H03F 1/3247 375/233 |
| 2008/0218262 A1* | 9/2008 | Ziegler | H04B 1/0475 330/149 |
| 2010/0060356 A1* | 3/2010 | Suzuki | H03F 1/3258 330/149 |
| 2010/0277236 A1* | 11/2010 | Horiguchi | H03F 1/30 330/149 |
| 2012/0068768 A1* | 3/2012 | Ishikawa | H03F 1/3247 330/149 |
| 2012/0200355 A1 | 8/2012 | Braithwaite | |
| 2014/0194073 A1* | 7/2014 | Wyville | H04B 1/525 455/73 |
| 2014/0348263 A1* | 11/2014 | Rollins | H04L 27/368 375/297 |

* cited by examiner

METHOD AND RADIO NODE FOR CONTROLLING RADIO TRANSMISSION

This application is a 371 of International Application No. PCT/SE2014/050652, filed May 27, 2014, the disclosure of which is fully incorporated herein by reference.

TECHNICAL FIELD

The present disclosure relates generally to a method and a radio node for controlling radio transmission in a transmitter frequency band so as to avoid or reduce interference in a victim frequency band.

BACKGROUND

In traditional wireless networks for radio communication, such as GSM networks, a single narrowband frequency carrier is typically used for transferring data and messages in radio signals between the network and a wireless device connected to an access point of the network, either for transmitting downlink signals from the network to the wireless device or for transmitting uplink signals from the wireless device to the network. Recently, increasingly advanced user terminals and devices have emerged on the market, e.g. smartphones, tablets and wireless laptops, which are suitable for services such as internet browsing, streaming of media and any other service involving communication of large amounts of data. The demands for high data throughput over radio has therefore increased immensely.

In this description, a "wireless device" may be any communication equipment capable of communicating radio signals with an access point of a wireless network, such as a base station. The wireless device in this context could also be referred to as a mobile terminal, mobile station, User Equipment (UE), etc., depending on the terminology used. Further, a "base station" is an access point of a wireless network, arranged to communicate radio signals with wireless devices. The term "radio node" will be used herein to represent both a base station capable of transmitting downlink signals and a wireless device capable of transmitting uplink signals. It should be noted that the radio node in this description may further be capable of receiving radio signals as well, which is however somewhat outside the scope of this solution. Thus, a base station is typically also capable of receiving uplink signals and a wireless device is typically also capable of receiving downlink signals. In the context of radio communication, the term "carrier" is typically used which refers to a radio transmission on a certain frequency carrying information.

Traditionally, one carrier has been used for transferring information from a sending node to a receiving node. To meet the greater demands for data throughput, the possibility of using two or more carriers in parallel has been introduced such that the amount of data that can be communicated per time unit in either downlink or uplink, also referred to as data throughput, is basically multiplied by the number of carriers used. This feature thus introduces multiple parallel carriers transmitted on different frequencies to or from the same radio node, which thus means that a wider transmission bandwidth is used as compared to a single carrier which is transmitted within a narrower transmission bandwidth. The wider transmitter band may also be divided into several bands, so-called multi-band transmission such as carrier aggregation which has been introduced to enable higher data throughput.

Unwanted emissions may occur inside of a transmitter band and outside the transmitter band referred to as out-of-band emissions. Unwanted emissions may be caused by Inter-Modulation Distortion, IMD, causing spectral regrowth of transmission signal. Unwanted emissions outside a nominal transmitter band or frequency range are typically generated from the modulation process and non-linearity in the transmitter in the wireless device, whereas emission further away in frequency, i.e. spurious emissions, are typically caused by unwanted transmitter effects such as harmonics emission, parasitic emission, intermodulation products and frequency conversion products. These effects are typically reduced when the output power of the transmitter is reduced. Moreover, the wider the transmission bandwidth, the wider the unwanted spectral emissions.

Radio transmissions from a radio node using one or more carriers within a nominal transmitter band may therefore cause interference on a "neighboring" victim band located close to the transmitter band, since the radio transmissions also cause the above-mentioned emissions outside the nominal transmitter band. The victim band may for example be used for reception or transmission by another radio equipment in the radio node itself or by another node located nearby. In this description, the term neighboring victim band merely implies that the victim band is close to the transmitter band in frequency domain, i.e. close enough to be affected by interference from the above-described out-of-band emissions. In particular, Inter-Modulation Distortion, IMD, is generated by the power amplifier in the radio node. The interference caused by IMD may be harmful, e.g. by disturbing a receiver's reception in a receiver band thus being the victim band, such that sensitivity of the receiver is degraded. In this description, the term "victim band" represents any frequency band in which interference can be harmful and where it is desirable to avoid or at least reduce the interference caused by transmission in the transmitter band. Even though the described victim band is typically a receiver band, the description is not limited thereto.

For example, the transmitter band and the victim band may be used for transmission and reception, respectively, at the same node, e.g. at a base station or at a wireless device, as illustrated in FIG. 1 where a radio node 100 transmits radio signals in a transmitter band from a transmitter antenna 100a. This transmission includes IMD products outside the nominal transmitter band which are received by a receiver antenna 100b in a receiver band in the form of interference, as indicated by a dashed arrow. Alternatively, the same antenna may be used for both transmission and reception in a conventional manner. The above-described interference may also hit a co-located or adjacent node 102 where the transmitter antenna is more or less close to the receiver antenna, when generated IMD products are within the receiver band. In either case, it is desirable to avoid or at least reduce the above-described interference on the receiver band.

FIG. 2 illustrates that when a radio node transmits two radio signals S1 and S2 on different carriers using a power amplifier in a conventional manner, a number of IMD components are also generated by the power amplifier. The generated IMD components are denoted IMD3, IMD5 and IMD7 which are distributed symmetrically on either side of the nominal frequency band used for transmitting the signals S1 and S2. The power amplifier may also generate further IMD components of higher order depending on the amplifier's design but the following examples refer to the first three IMD components IMD3, IMD5 and IMD7 for simplicity. If the frequency of any of these IMD components coincides with a victim band such as a receiver band, they will cause interference on the victim band. This can be avoided or reduced by employing a duplex filter after the power amplifier which is capable of filtering away the harmful IMD components generated by the power amplifier, before the signals are emitted from the transmit antenna.

Another known way of handling IMD components is to apply Digital Pre-Distortion, DPD, on the signal before the power amplifier which effectively generates inverse distortion products at the frequencies of the IMD components, e.g. IMD3, IMD5 and IMD7, as illustrated by dashed arrows in FIG. 2, such that the inverse distortion components more or less cancel out the IMD components generated in the power amplifier. In other words, DPD generates IMD components with inverse amplitude and phase compared to the power amplifier generated IMD components such that the sum of the DPD generated IMD components and the power amplifier generated IMD components is minimized. DPD is an operation which uses a sampling technique in a well-known manner to generate the inverse distortion products. Briefly described, the DPD operation basically creates an inverse DPD model of the power amplifier's non-linearity and the inverse distortion products are created by applying the inverse DPD model to the signal to be transmitted. DPD is an example of a linearization technique for cancelling out IMD components while other linearization techniques such as Analog Pre-Distortion, APD, can also be used.

However, there are some problems associated with the above techniques for avoiding emission of harmful IMD components from the radio node. Firstly, the DPD technique may be feasible to employ when the transmitter band is fairly narrow, but if a wider transmitter band is employed the DPD technique is more difficult since more advanced equipment is needed for achieving a sufficiently high sampling rate in the DPD process in order to generate a DPD correction band that is wide enough to suppress the broader distribution of IMD components outside the nominal transmitter band. A high sampling rate also give rise to an increased power consumption. In particular, the DPD technique is normally employed in wireless devices only in a simplified way, if at all, due to the relatively high costs and high power consumption, and it would be even more costly to employ to allow two or more carriers to be transmitted.

Secondly, a relatively advanced duplex filter of high performance is required to filter away any IMD components generated by the power amplifier outside the nominal transmitter band, before the signals are emitted from the radio node's transmitting antenna. In conclusion, if multiple carriers are to be employed it is necessary to suppress a relatively broad distribution of IMD components outside the nominal transmitter band, which in turn requires the use of a linearization technique such as DPD with relatively high sampling rate and/or a duplex filter capable of filtering away the IMD components. It is thus a problem that the above-described DPD technique and the advanced duplex filter are costly and complex to employ, and may also result in high power consumption which may not be feasible e.g. in a wireless device.

FIGS. 3a and 3b are similar diagrams that illustrate schematically how the DPD correction band must be made wider if the nominal transmitter bandwidth is increased, e.g. by using a greater number of carriers for transmitting radio signals. In FIG. 3a, only one carrier is used which corresponds to a relatively narrow transmitter band C1. As a result, the IMD components IMD3, IMD5 and IMD7 generated by the transmission are relatively close to the band C1 in frequency domain. In order to avoid or reduce the interference on a neighboring victim band 302a, a relatively narrow DPD correction band 304a is sufficient to suppress e.g. the first two IMD components IMD3 and IMD5 on either side of the transmitter band C1, assuming that IMD7 is weak and not harmful in terms of interference in this example.

On the other hand, FIG. 3b illustrates another example when multiple carriers are used which correspond to a relatively wide transmitter band C2. As a result, the IMD components IMD3, IMD5 and IMD7 generated by the transmission becomes both stronger and further away from the band C2 in frequency domain. In order to avoid or reduce the interference on a neighboring victim band 302b, a much wider DPD correction band 304b is therefore required to suppress the IMD components IMD3, IMD5 and IMD7, in case all of them are strong enough to be harmful in terms of interference. As explained above, it is both costly and power consuming to achieve such a wide DPD correction band at the radio node.

SUMMARY

It is an object of embodiments described herein to address at least some of the problems and issues outlined above. It is possible to achieve this object and others by using a method and a radio node as defined in the attached independent claims.

According to one aspect, a method is performed by a radio node when operating in a wireless network for controlling transmission of radio signals in a transmitter band to avoid or reduce interference in a victim band. The victim band is separate from the transmitter band in frequency domain. In this method, the radio node applies Digital Pre-Distortion, DPD, on signals to be transmitted from the radio node on at least one carrier in the transmitter band, such that Intermodulation Distortion, IMD, components of the signals are pre-distorted asymmetrically relative the at least one carrier to suppress at least one of the IMD components falling within the victim band. The radio node then amplifies the pre-distorted signals in a power amplifier and transmits the amplified signals on the at least one carrier.

According to another aspect, a radio node, being capable of operating in a wireless network, is arranged to control transmission of radio signals in a transmitter band to avoid or reduce interference in a victim band, the victim band being separate from the transmitter band in frequency domain. The radio node comprises means configured to apply DPD on the signals to be transmitted from the radio node on at least one carrier in the transmitter band, e.g. by means of an applying module, such that IMD components of the signals are pre-distorted asymmetrically relative the at least one carrier to suppress at least one of the IMD components falling within the victim band.

The radio node also comprises means configured to amplify the pre-distorted signals in a power amplifier, and to transmit the amplified signals on the at least one carrier, e.g. by means of a transmitting module.

Further aspects include a computer program comprising instructions which, when executed on at least one processor, cause the at least one processor to carry out the above method, and also a program carrier containing the computer program. The program carrier may be an electronic signal, optical signal, radio signal, or computer readable storage medium.

Advantages that may be achieved when employing any of the above aspects include, without limitation, that interference to the victim band can be avoided or at least reduced without requiring a very wide DPD correction band nor the use of an advanced and expensive filter in the radio node, which will be explained in more detail below.

The above method and radio node may be configured and implemented according to different optional embodiments to accomplish further features and benefits, to be described below.

BRIEF DESCRIPTION OF DRAWINGS

The solution will now be described in more detail by means of exemplary embodiments and with reference to the accompanying drawings, in which.

DETAILED DESCRIPTION

Briefly described, a solution is provided which can be used to avoid or at least reduce the risk for interference on a victim band caused by a radio node when transmitting signals in a transmitter band.

Figure 4:
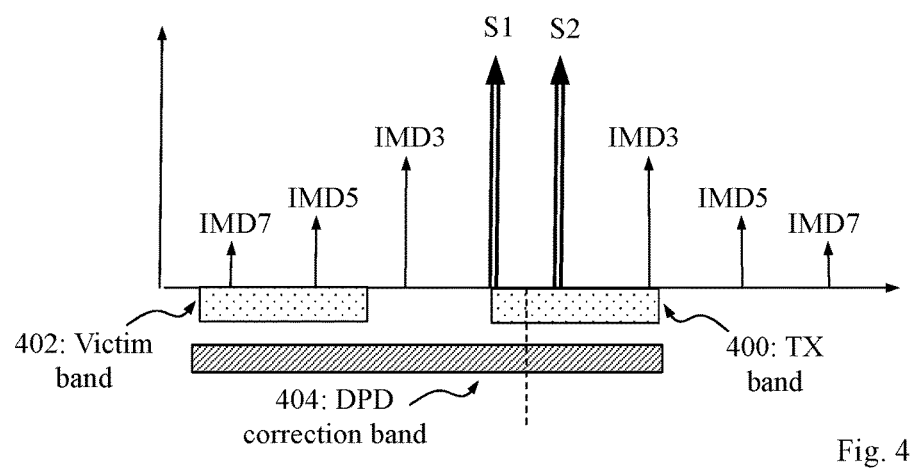
FIG. 4 is a diagram illustrating how IMD products generated by transmissions from a radio node can be suppressed by DPD, according to some possible embodiments.

This can be achieved by applying asymmetric DPD on the signals to be transmitted by a radio node such that the signals are pre-distorted asymmetrically relative to a nominal transmitter band comprising at least one carrier on which the signals will be transmitted. Thereby, the resulting DPD correction band will be located in an asymmetric position in frequency domain relative to the nominal transmitter band. An example of this is illustrated in FIG. 4 where two signals S1 and S2 are transmitted by a radio node on separate carriers within a transmission band 400. As usual, the power amplifier generates IMD components such as IMD3, IMD5 and IMD7 which are distributed symmetrically in frequency domain on either side of the transmitted signals S1, S2. As noted above, further IMD components of higher order may also be generated which can be disregarded in this disclosure for simplicity.

Figure 1:
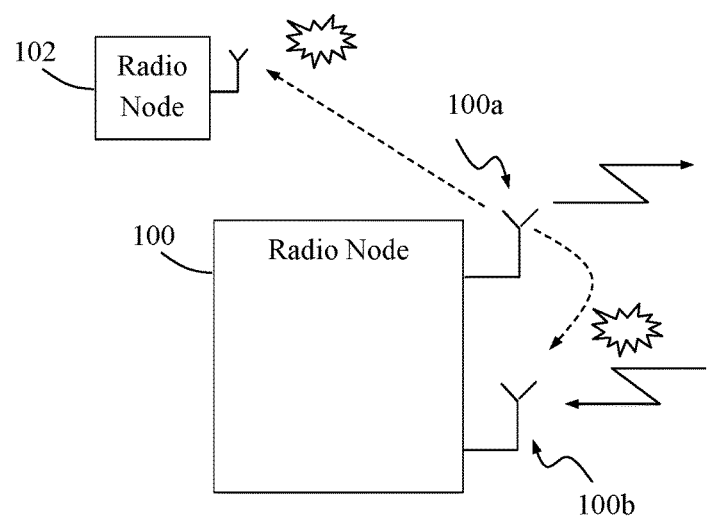
FIG. 1 illustrates how transmissions from a radio node may cause interference to signals received by the radio node.
Figure 2:
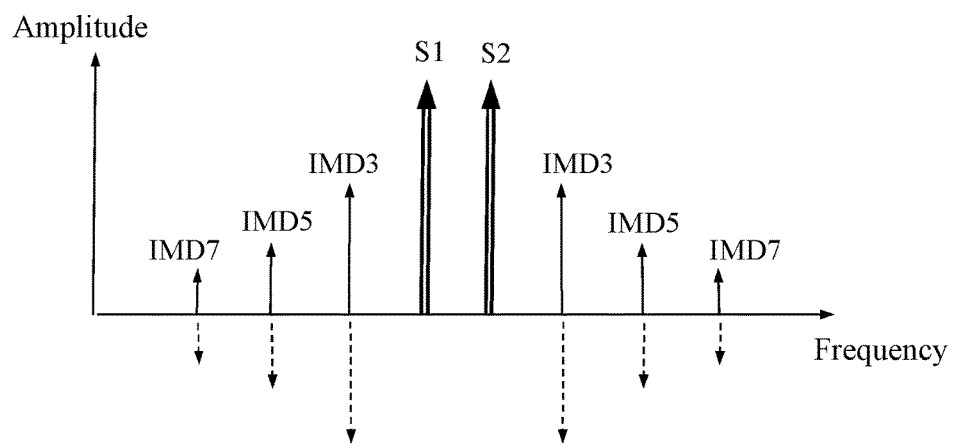
FIG. 2 is a diagram illustrating how IMD products generated by transmissions from a radio node can be suppressed by DPD.
Figure 3A:
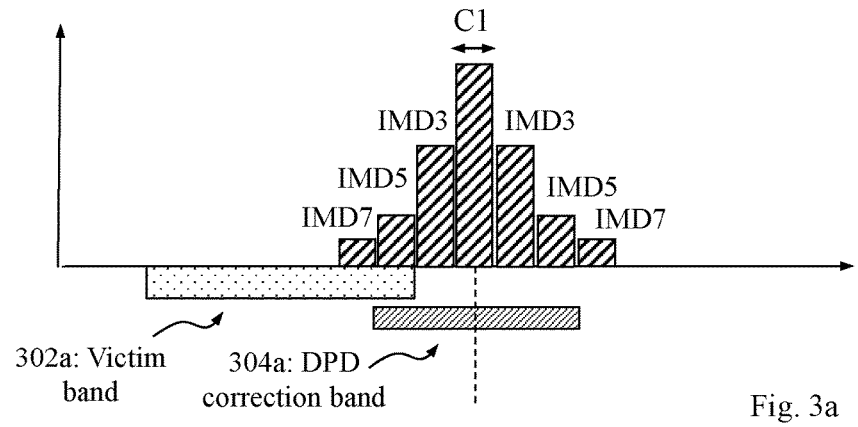
FIG. 3a and FIG. 3b are diagrams illustrating how different bandwidths of transmissions from a radio node can generate IMD products.
Figure 3B:
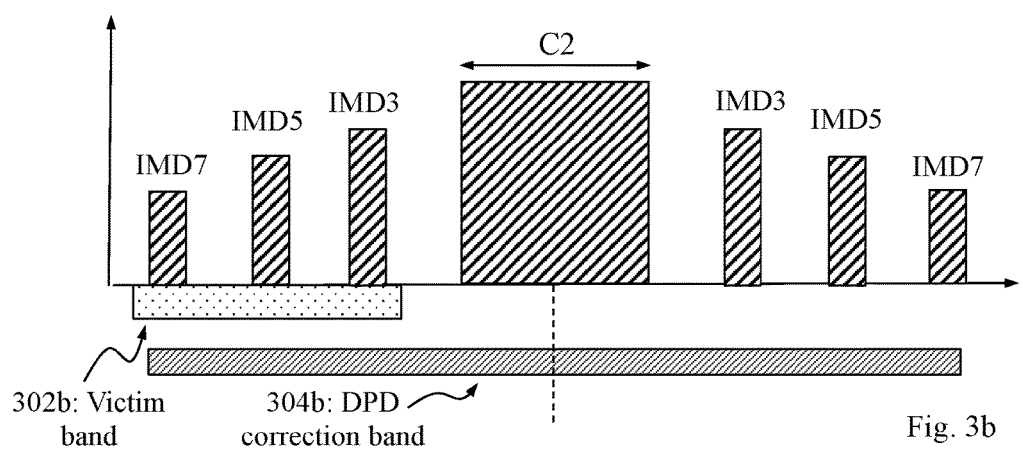

In this example, a victim band 402 located close to band 400 is used by the radio node itself or by another co-located or adjacent node, e.g. for receiving other signals, where the victim band 402 is separate from the transmitter band 400 in frequency domain. It can be seen in this figure that the signals S1 and S2 themselves will not interfere on the victim band 402, but their IMD components IMD5 and IMD7 on the left side, i.e. below S1 and S2, will do so by occurring within the victim band 402. It is therefore desirable or even necessary to suppress the coinciding IMD components IMD5 and IMD7 on the left side by means of applying DPD, which would be costly and power consuming to achieve if the conventional DPD technique was to be applied to create a symmetric DPD correction band which must be quite wide to suppress IMD5 and IMD7 on both sides, as explained for FIG. 3b above.

In this solution, however, the radio node applies asymmetric DPD on the signals Si and S2 such that only some of the IMD components are pre-distorted asymmetrically relative the carriers of signals S1 and S2 to suppress the IMD components that fall within the victim band 402, in this case IMD5 and IMD7 on the left side, i.e. below the signals S1 and S2, while the IMD components IMD5 and IMD7 on the right side, i.e. above the signals S1 and S2 are left without pre-distortion. In other words, the DPD correction band 404 will be positioned asymmetrically relative to signals S1 and S2 to cover IMD5 and IMD7 only on the left side which will thus be suppressed and not cause interference on the victim band 402.

It will be described later below how such an asymmetrical position of the DPD correction band 404 can be accomplished. In short, a shifting signal, denoted $f_{CIF}$ herein, is multiplied with the signals before they enter the power amplifier, where the frequency of the shifting signal $f_{CIF}$ determines the position of the DPD correction band in frequency domain. Specifically, the shifting signal's frequency can be selected such that the DPD correction band at least partly coincides with the victim band. The width of the DPD correction band is determined by the sampling rate used in the DPD process, as mentioned above. Thus the extension of the DPD correction band can be accurately controlled by setting the shifting signal's frequency and the DPD sampling rate in a fitting manner. This solution further allows for rapid adjustment of the DPD correction band which can be made on a dynamic basis, e.g. dependent on the current instantaneous traffic load.

Figure 5:
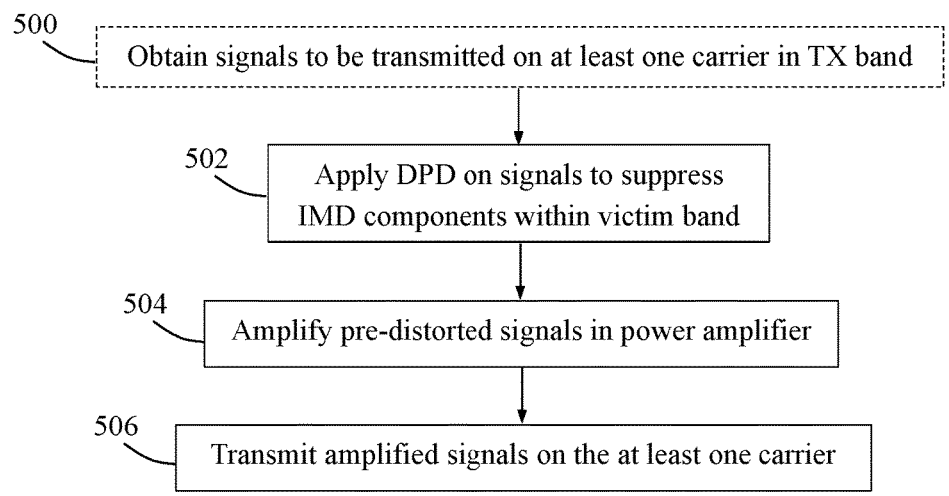
FIG. 5 is a flow chart illustrating a procedure that may be performed by a radio node, according to further possible embodiments.

An example of a procedure, performed by a radio node when operating in a wireless network, for controlling transmission of radio signals in a transmitter band to avoid or reduce interference in a victim band, will now be described with reference to the flow chart in FIG. 5. In this procedure, it is assumed that the victim band is separate from the transmitter band in frequency domain. The terms victim band and transmitter band have been defined above.

An optional first action 500 illustrates that the radio node obtains signals to be transmitted from the radio node on at least one carrier in the transmitter band. The signals to be transmitted are typically obtained in a conventional manner from a modulation function or the like in the radio node, which is however not pertinent to the scope of this solution.

In a next shown action 502, the radio node applies DPD on the signals to be transmitted such that IMD components of the signals are pre-distorted asymmetrically relative the at least one carrier to suppress at least one of the IMD components falling within the victim band. This is done by generating inverse IMD components as described above. In this way, asymmetric DPD is applied on the signals to be transmitted.

The radio node then amplifies the pre-distorted signals in a power amplifier in a next action 504. Thereby, the inverse IMD components will more or less cancel out the IMD components generated by the power amplifier, i.e. at least one of those IMD components lying within the victim band. Finally, the radio node transmits the amplified signals on the at least one carrier, in a further action 506.

It is an advantage of the above-described procedure that asymmetric DPD is accomplished such that any harmful IMD components that are deemed to cause interference on the victim band can be cancelled out, or at least reduced to a non-harmful level, without requiring a very high sampling rate in the DPD process. Thereby, the DPD can be applied with low costs, low power consumption and less complexity which in turn also facilitates employment of DPD in wireless devices. Another advantage is that requirements on the radio node's duplex filter are relaxed since it does not have to filter away the already suppressed harmful IMD components.

Figure 6:
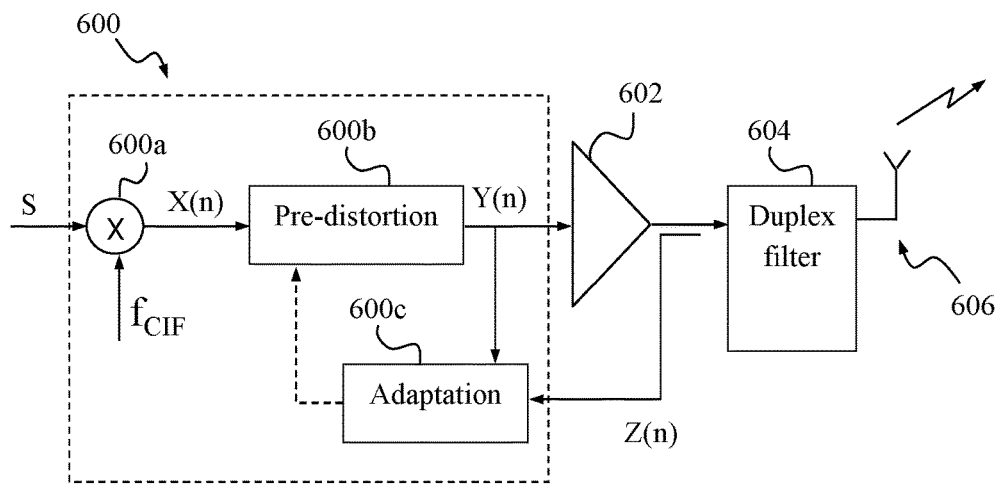
FIG. 6 is a block diagram illustrating a practical example of how IMD products can be suppressed by DPD in a radio node, according to further possible embodiments.

In the above-described procedure, several optional embodiments are possible to employ as follows. In one possible embodiment, the DPD is applied over a DPD correction band, and wherein the above-mentioned shifting signal $f_{CIF}$ is multiplied with the signals to be transmitted to shift the DPD correction band in frequency domain asymmetrically relative the signals to be transmitted. FIG. 6 illustrates a practical example of how this embodiment can be used in a radio node which comprises a DPD circuit 600, a power amplifier 602 and a duplex filter 604. A signal S to be transmitted enters the DPD circuit 600 where the DPD is applied before the signal is amplified by the power amplifier 602 and filtered in the duplex filter 604. The signal S is then transmitted from an antenna 606.

In more detail, the signal S is first multiplied by the shifting signal $f_{CIF}$ at 600a, which shifts the signal into a modified transmission signal X(n). As mentioned above, the frequency of the shifting signal $f_{CIF}$ determines the position of the DPD correction band in frequency domain relative to the signal and can be selected to define allocation of the DPD correction band so that it covers one or more IMD components to be suppressed as desired. The shifted transmission signal X(n) then enters a pre-distortion block 600b which applies DPD on the signal to create a pre-distorted transmission signal Y(n). The pre-distortion block 600b thus generates inverse IMD components as explained above. The pre-distorted transmission signal Y(n) is then amplified by the power amplifier 602 and filtered in the duplex filter 604 before it is transmitted from the antenna 606.

The pre-distorted transmission signal Y(n) is also fed into an adaptation block 600c and a feed-back signal Z(n) collected from the amplifier's output is also fed into the adaptation block 600c which accordingly adjusts the pre-distortion block 600b based on the signals Y(n) and Z(n) in an iterative manner, as indicated by a dashed arrow, so that the DPD process in the pre-distortion block 600b is adapted to form an inverse power amplifier model. Thereby, the desired suppression of one or more IMD components generated by the power amplifier 602 can be achieved. The pre-distorted transmission signal Y(n) is also converted into radio frequency, not shown, before entering the power amplifier 602, and the feed-back signal Z(n) is correspondingly converted back from the radio frequency, not shown, before entering the adaptation block 600c.

Figure 7:
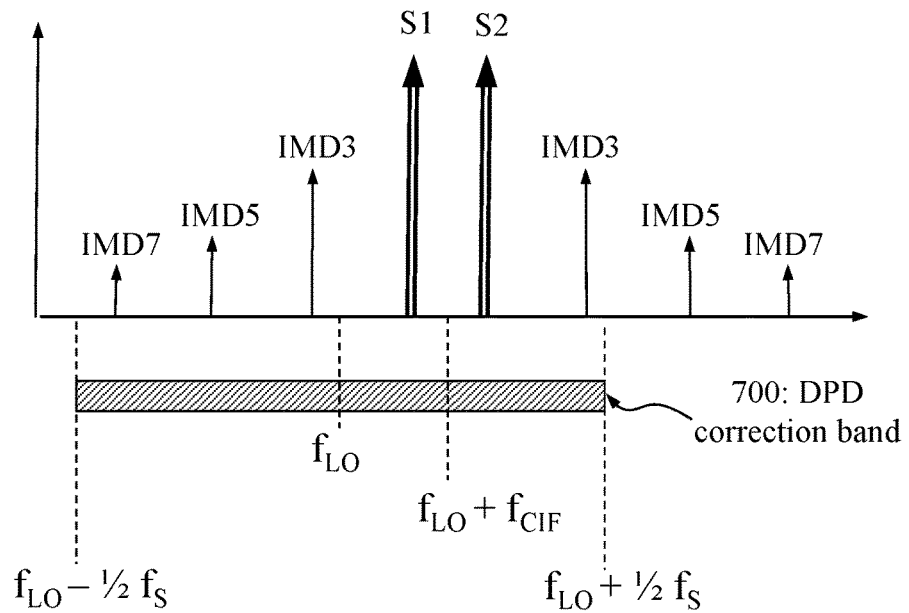
FIG. 7 is a diagram illustrating how a DPD correction band may be formed, according to further possible embodiments.

In another possible embodiment, the radio node may select the frequency of the shifting signal $f_{CIF}$ based on the victim band's location in frequency domain such that the DPD correction band at least partly coincides with the victim band. Another possible embodiment may be to apply the DPD in the radio node by using a sampling frequency $f_s$, which corresponds to the above-mentioned sampling rate, which determines the width of the DPD correction band, which is illustrated by the diagram in FIG. 7. The DPD correction band 700 extends symmetrically around an RF frequency $f_{LO}$ from $f_{LO}-\frac{1}{2}f_s$ to $f_{LO}+\frac{1}{2}f_s$ according to Nyquist theory which is well-known in the field of radio communication, where "LO" indicates Local Oscillator. The width of DPD correction band 700 in frequency domain is thus equal to the sampling frequency $f_s$. It can be seen in the figure that by multiplying the shifting signal $f_{CIF}$ with the signals S1, S2, the centre of the signals S1, S2 to be transmitted is shifted from $f_{LO}$ to $f_{LO}+f_{CIF}$, thus effectively shifting the DPD correction band in frequency domain asymmetrically relative to the signals S1, S2.

In a further possible embodiment, the radio node may select the sampling frequency $f_s$ such that at least one of the IMD components is within the DPD correction band. As mentioned above, the extension of the DPD correction band, i.e. its position and width, can be accurately controlled by setting the frequency of the shifting signal $f_{CIF}$ and the DPD sampling rate or frequency $f_s$ such that any harmful IMD components is within the DPD correction band. These two parameters $f_{CIF}$ and $f_s$ can be dynamically adjusted depending on various factors such as the current position and utilization of the transmission band and/or the victim band. In another possible embodiment, the radio node may select the sampling frequency $f_s$ such that the victim band is within the DPD correction band. In further possible embodiments, the radio node may be a base station or a wireless device.

It was suggested above that the operation of asymmetric DPD may be changed or adjusted at any time, e.g. during the operation or at the startup of the radio node, depending on various factors, to ensure that any harmful IMD component(s) falling within the victim band is/are suppressed as desired. The asymmetric DPD correction band may be changed back to normal symmetric DPD correction band, if needed.

In further possible embodiments, the extension, i.e. position and width, of the asymmetric DPD correction band may be dynamically controlled based on current radio characteristics of the transmission signals, if needed. The extension of the asymmetric DPD correction band may be controlled based on information about current radio characteristics of the transmission signals and/or current radio characteristics of one or more reception signals received in the victim band. The current radio characteristics may pertain to at least one of: frequency of the transmission, frequency of the reception signals, expected power level or amplitude of any harmful IMD component(s) such as IMD3,5,7, current transmission power, current received signal power, and so forth. As mentioned above, the asymmetric position of the DPD correction band relative to the transmission frequency can be changed by changing the frequency of the shifting signal $f_{CIF}$.

The asymmetric position of the DPD correction band relative to the transmission frequency may further be changed based on information of the currently used operational band, e.g. according to the third Generation Partnership Project, 3GPP. For example, the radio node may support multiple frequency bands e.g. 3GPP and 25 and 3GPP band 4. If the transmitter band and the receiver band are relatively close to each other, referred to as small UL/DL separation, then asymmetric DPD correction band may be applied e.g. for 3GPP band 25, while normal symmetric DPD correction band may be used for 3GPP band 4 where the UL/DL separation is high, i.e. the transmitter band and the receiver band are sufficiently far from each other in frequency domain.

If the radio node support multiple frequencies in the same radio transmitter, such as a modern multiband mobile phone a base station, then operation of asymmetric DPD may be changed based on a command from another network node.

For example, an OSS, Operations Support System, node may command a base station, or a base station may command a wireless device, to change operational frequency within a current operational band, or to change operational frequency band e.g. from first 3GPP operational frequency band to the second 3GPP operational frequency band of transmission and/or reception, to avoid harmful interference on a receiver band being the victim band.

The asymmetric position of the DPD correction band relative to a transmission band may further be selected based on a frequency allocation gap to another radio system. For example, current mobile phones may include multiple radio interfaces to different radio systems such as 3GPP, Wifi and Bluetooth. If the radio node operates at 3GPP band 7 and Wifi is activated, then asymmetric DPD may be activated if the frequency allocation gap between the 3GPP band 7 and the Wifi band is not enough wide.

Figure 8:
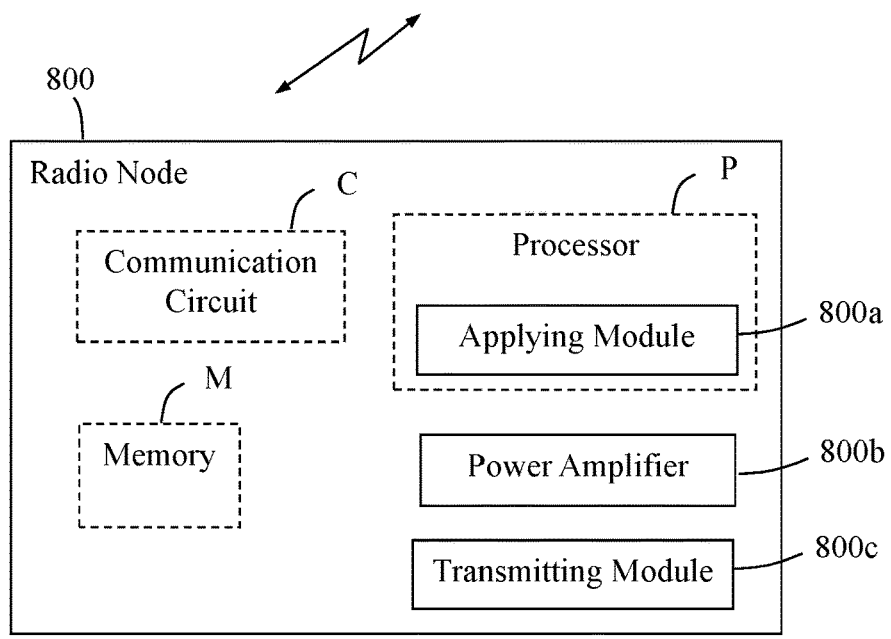
FIG. 8 is a block diagram illustrating how a radio node may be configured in more detail, according to further possible embodiments.

A detailed but non-limiting example of how a radio node may be structured with some possible functional entities such as modules, circuits or units, to bring about the above-described functionality of the wireless device, is illustrated by the block diagram in FIG. 8. In this figure, the radio node 800 is operable in a wireless network and arranged to control transmission of radio signals in a transmitter band to avoid or reduce interference in a victim band, the victim band being separate from the transmitter band in frequency domain.

The radio node 800 may be configured to operate according to any of the examples and embodiments of employing the solution as described above and as follows. In particular, the radio node 800 may comprise means arranged or configured to perform at least the actions of the flow chart in FIG. 5 and possibly also to operate in the manner described for any of FIGS. 4, 6 and 7. In order to put any of this into practice, the radio node 800 may be implemented with a communication circuit C, a memory M and an operable processor P comprising various functional modules as described below.

More specifically, the radio node 800 comprises means configured to apply DPD on the signals to be transmitted from the radio node 800 on at least one carrier in the transmitter band, such that IMD components of the signals are pre-distorted asymmetrically relative the at least one carrier to suppress at least one of the IMD components falling within the victim band. This applying operation may be performed by an applying module 800a, e.g. in the manner described for action 502 above.

The radio node 800 also comprises means configured to amplify the pre-distorted signals which may be done by a power amplifier 800b, basically as described for action 504 above. The radio node 800 further comprises means configured to amplify the pre-distorted signals which may be done by a transmitting module 800c, basically as described for action 506 above.

It should be noted that FIG. 8 illustrates some possible functional modules in the radio node 800 and the skilled person is able to implement these functional modules in practice using suitable software and hardware. Thus, the solution is generally not limited to the shown structures of the radio node 800, and the functional modules 800a-c may be configured to operate according to any of the features described in this disclosure, where appropriate.

The embodiments and features described herein may be implemented in a computer program comprising instructions which, when executed on at least one processor, cause the at least one processor to carry out the above actions e.g. as described for any of FIGS. 4-8. Further, the above-described embodiments may be implemented in a program carrier containing the above computer program, wherein the program carrier is one of an electronic signal, optical signal, radio signal, or computer readable storage medium. The computer readable storage medium may be a compact disc or other program carrier suitable for holding the computer program. Some examples of how the computer program and the program carrier can be realized in practice are outlined below and with further reference to FIG. 8.

The processor P may comprise a single Central Processing Unit (CPU), or could comprise two or more processing units. For example, the processor P may include a general purpose microprocessor, an instruction set processor and/or related chips sets and/or a special purpose microprocessor such as an Application Specific Integrated Circuit (ASIC). The processor P may also comprise a storage for caching purposes.

The memory M may comprise the above-mentioned computer readable storage medium or program carrier on which the computer program is stored e.g. in the form of computer program modules or the like. For example, the memory M may be a flash memory, a Random-Access Memory (RAM), a Read-Only Memory (ROM) or an Electrically Erasable Programmable ROM (EEPROM).

While the solution has been described with reference to specific exemplary embodiments, the description is generally only intended to illustrate the inventive concept and should not be taken as limiting the scope of the solution. For example, the terms "radio node", "transmitter band", "victim band", "receiver band", "Intermodulation Distortion, IMD, components", "Digital Pre-Distortion, DPD" and "DPD correction band" have been used throughout this description, although any other corresponding entities, functions, and/or parameters could also be used having the features and characteristics described here. The solution is defined by the appended claims.

The invention claimed is:

1. A method performed by a radio node when operating in a wireless network, for controlling transmission of radio signals in a transmitter band to avoid or reduce interference in a victim band, the victim band being separate from the transmitter band in frequency domain, the method comprising:

applying Digital Pre-Distortion (DPD) on signals to be transmitted from the radio node on at least one carrier in the transmitter band, such that Intermodulation Distortion (IMD) components of the signals are pre-distorted on another band in the frequency domain that is asymmetrically relative to the at least one carrier to suppress at least one of the IMD components falling within the victim band;

amplifying the pre-distorted signals in a power amplifier; and, transmitting the amplified signals on the at least one carrier;

wherein the DPD is applied over a DPD correction band comprising the another band in the frequency domain, and wherein a shifting signal ($f_{CIF}$) is multiplied with the signals to be transmitted to shift the DPD correction band in frequency domain asymmetrically relative the signals to be transmitted; and, wherein a frequency of the shifting signal ($f_{CIF}$) is selected based on the victim band's location in frequency domain such that the DPD correction band at least partly coincides with the victim band.

2. The method according to claim 1, wherein the DPD is applied by using a sampling frequency ($f_s$) which determines the width of the DPD correction band.

3. The method according to claim 2, wherein the sampling frequency is selected such that at least one of the IMD components is within the DPD correction band.

4. The method according to claim 2, wherein the sampling frequency is selected such that the victim band is within the DPD correction band.

5. The method according to claim 1, wherein the radio node adjusts extension of the DPD correction band based on at least one of: frequency of the transmitted signals, frequency of signals received in the victim band, expected power level or amplitude of the IMD components, current transmission power, and current received signal power.

6. The method according to claim 1, wherein the radio node is a base station or a wireless device.

7. A non-transitory computer-readable medium comprising instructions which, when executed on at least one processor, cause the at least one processor to carry out the method according to claim 1.

8. A radio node capable of operating in a wireless network, the radio node being arranged to control transmission of radio signals in a transmitter band to avoid or reduce interference in a victim band, the victim band being separate from the transmitter band in frequency domain, the radio node comprising means configured to:
apply Digital Pre-Distortion (DPD) on the signals to be transmitted from the radio node on at least one carrier in the transmitter band, such that Intermodulation Distortion (IMD) components of the signals are pre-distorted on another band in the frequency domain that is asymmetrically relative the at least one carrier to suppress at least one of the IMD components falling within the victim band;
amplify the pre-distorted signals in a power amplifier; and,
transmit the amplified signals on the at least one carrier;
wherein the DPD is applied over a DPD correction band comprising the another band in the frequency domain, and wherein a shifting signal ($f_{CIF}$) is multiplied with the signals to be transmitted to shift the DPD correction band in frequency domain asymmetrically relative the signals to be transmitted; and,
wherein a frequency of the shifting signal ($f_{CIF}$) is selected based on the victim band's location in frequency domain such that the DPD correction band at least partly coincides with the victim band.

9. The radio node according to claim 8, comprising means configured to apply the DPD by using a sampling frequency ($f_s$) which determines the width of the DPD correction band.

10. The radio node according to claim 9, comprising means configured to select the sampling frequency such that at least one of the IMD components is within the DPD correction band.

11. The radio node according to claim 9, comprising means configured to select the sampling frequency such that the victim band is within the DPD correction band.

12. The radio node according to claim 8, comprising means configured to adjust extension of the DPD correction band based on at least one of: frequency of the transmitted signals, frequency of signals received in the victim band, expected power level or amplitude of the IMD components, current transmission power, and current received signal power.

13. The radio node according to claim 8, wherein the radio node is a base station or a wireless device.

* * * * *

UNITED STATES PATENT AND TRADEMARK OFFICE
CERTIFICATE OF CORRECTION

PATENT NO.      : 10,103,775 B2
APPLICATION NO. : 15/313164
DATED           : October 16, 2018
INVENTOR(S)     : Heinikoski et al.

It is certified that error appears in the above-identified patent and that said Letters Patent is hereby corrected as shown below:

On the Title Page

In Item (72), under "Inventors", in Column 1, Lines 1-2, delete "Marko E Leinonen," and insert -- Marko E. Leinonen, --, therefor.

In the Specification

In Column 6, Line 10, delete "Si and S2" and insert -- S1 and S2 --, therefor.

Signed and Sealed this
Twenty-second Day of January, 2019

Andrei Iancu
*Director of the United States Patent and Trademark Office*